(12) United States Patent
Roberts et al.

(10) Patent No.: US 11,551,990 B2
(45) Date of Patent: *Jan. 10, 2023

(54) METHOD AND APPARATUS FOR PROVIDING THERMAL WEAR LEVELING

(71) Applicant: Advanced Micro Devices, Inc., Sunnyvale, CA (US)

(72) Inventors: David A. Roberts, Boxborough, MA (US); Greg Sadowski, Boxborough, MA (US); Steven Raasch, Boxborough, MA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/674,607

(22) Filed: Aug. 11, 2017

(65) Prior Publication Data

US 2019/0051576 A1 Feb. 14, 2019

(51) Int. Cl.
*H01L 23/34* (2006.01)
*G05B 15/02* (2006.01)
*H01L 25/065* (2006.01)
*G06F 1/20* (2006.01)

(52) U.S. Cl.
CPC .............. *H01L 23/34* (2013.01); *G05B 15/02* (2013.01); *G06F 1/20* (2013.01); *H01L 25/0657* (2013.01); *H01L 2225/06589* (2013.01)

(58) Field of Classification Search
CPC ........ G06F 9/50; G06F 9/5083; G06F 9/5094; H01L 23/34; H01L 25/0657; H01L 2225/06589; G05B 15/02

USPC ......................................... 718/105, 100, 104
See application file for complete search history.

(56) References Cited

U.S. PATENT DOCUMENTS

| 5,805,403 | A | 9/1998 | Chemla |
| 5,881,298 | A | 3/1999 | Cathey |
| 5,896,259 | A | 4/1999 | Farwell et al. |
| 7,353,325 | B2 * | 4/2008 | Lofgren .................. G11C 8/12 365/185.3 |
| 7,356,442 | B1 * | 4/2008 | Astigarraga .......... G06F 11/008 702/182 |

(Continued)

OTHER PUBLICATIONS

Seongmoo Heo, K. Barr and K. Asanovic, "Reducing power density through activity migration," Proceedings of the 2003 International Symposium on Low Power Electronics and Design, 2003. ISLPED '03., 2003, pp. 217-222. (Year: 2003).*

(Continued)

*Primary Examiner* — Andrew M. Lyons (57) ABSTRACT

Exemplary embodiments provide thermal wear spreading among a plurality of thermal die regions in an integrated circuit or among dies by using die region wear-out data that represents a cumulative amount of time each of a number of thermal die regions in one or more dies has spent at a particular temperature level. In one example, die region wear-out data is stored in persistent memory and is accrued over a life of each respective thermal region so that a long term monitoring of temperature levels in the various die regions is used to spread thermal wear among the thermal die regions. In one example, spreading thermal wear is done by controlling task execution such as thread execution among one or more processing cores, dies and/or data access operations for a memory.

19 Claims, 6 Drawing Sheets

(56) References Cited

U.S. PATENT DOCUMENTS

| | | | |
|---|---|---|---|
| 7,421,623 B2* | 9/2008 | Haugh | G06F 1/206 702/130 |
| 7,886,167 B2 | 2/2011 | Burton | |
| 8,074,110 B2* | 12/2011 | Vera | G06F 1/206 714/11 |
| 8,224,639 B2* | 7/2012 | Inoue | G06F 1/206 703/18 |
| 8,378,271 B2 | 2/2013 | O'Neil et al. | |
| 8,595,731 B2* | 11/2013 | Bose | G06F 9/46 712/220 |
| 8,677,057 B1* | 3/2014 | Cornwell | G06F 12/0246 711/103 |
| 8,942,857 B2* | 1/2015 | Anderson | G06F 1/206 700/299 |
| 9,087,146 B2* | 7/2015 | Rusu | G06F 11/3024 |
| 9,148,910 B1 | 9/2015 | Mimran et al. | |
| 9,317,350 B2* | 4/2016 | Cher | G06F 11/3037 |
| 9,342,443 B2 | 5/2016 | Walker et al. | |
| 9,690,696 B1* | 6/2017 | Hefner | G06F 12/0246 |
| 10,416,903 B2* | 9/2019 | Fackenthal | G06F 12/0238 |
| 10,642,505 B1* | 5/2020 | Kuzmin | G06F 3/0647 |
| 2002/0087904 A1 | 7/2002 | Cai | |
| 2003/0110012 A1* | 6/2003 | Orenstien | G06F 1/206 702/188 |
| 2004/0128663 A1* | 7/2004 | Rotem | G06F 1/206 717/161 |
| 2006/0095911 A1* | 5/2006 | Uemura | G06F 1/206 718/100 |
| 2006/0095913 A1* | 5/2006 | Bodas | G06F 9/5027 718/100 |
| 2006/0236035 A1* | 10/2006 | Barlow | G06F 11/0733 711/118 |
| 2008/0058999 A1* | 3/2008 | Khodorkovsky | G06F 1/3296 700/297 |
| 2009/0064164 A1* | 3/2009 | Bose | G06F 9/5027 718/105 |
| 2009/0089792 A1* | 4/2009 | Johnson | G06F 9/4881 718/105 |
| 2009/0210741 A1* | 8/2009 | Yamaoka | G06F 1/206 713/600 |
| 2009/0288094 A1* | 11/2009 | Allen | G06F 9/5027 718/104 |
| 2009/0328055 A1* | 12/2009 | Bose | G06F 1/3203 718/105 |
| 2010/0049995 A1 | 2/2010 | Casey et al. | |
| 2010/0180089 A1* | 7/2010 | Flemming | G06F 1/206 711/157 |
| 2010/0253416 A1 | 10/2010 | Ishii | |
| 2011/0191776 A1* | 8/2011 | Bose | G06F 9/46 718/102 |
| 2011/0265090 A1* | 10/2011 | Moyer | G06F 1/3203 718/103 |
| 2012/0032716 A1 | 2/2012 | Dinkjian et al. | |
| 2012/0272114 A1* | 10/2012 | Cho | G06F 11/141 714/748 |
| 2013/0043927 A1 | 2/2013 | Penzes et al. | |
| 2013/0047166 A1* | 2/2013 | Penzes | H03K 3/0315 718/105 |
| 2013/0138419 A1* | 5/2013 | Lopez | G06F 11/008 703/21 |
| 2013/0262751 A1* | 10/2013 | Kwak | G11C 16/3495 711/103 |
| 2014/0132334 A1 | 5/2014 | Park | |
| 2014/0181596 A1* | 6/2014 | Rusu | G06F 11/3024 714/47.3 |
| 2014/0245314 A1* | 8/2014 | Inoue | G06F 1/206 718/103 |
| 2014/0281311 A1* | 9/2014 | Walker | G06F 13/1668 711/162 |
| 2014/0328132 A1* | 11/2014 | Cordero | G11C 29/50012 365/200 |
| 2014/0344592 A1 | 11/2014 | Nussbaum | |
| 2015/0033081 A1* | 1/2015 | Bickford | G06F 11/3065 714/39 |
| 2015/0169363 A1* | 6/2015 | Anderson | G06F 9/4893 718/103 |
| 2015/0169382 A1* | 6/2015 | Anderson | G06F 9/5094 718/104 |
| 2015/0178138 A1* | 6/2015 | Saha | G06F 9/5094 718/104 |
| 2015/0286262 A1* | 10/2015 | Park | G05D 23/1917 713/320 |
| 2015/0375113 A1* | 12/2015 | Justice | A63F 13/355 463/42 |
| 2016/0048347 A1* | 2/2016 | Rangarajan | G06F 1/206 711/156 |
| 2016/0061667 A1* | 3/2016 | Hwang | G01K 7/00 374/183 |
| 2016/0086654 A1* | 3/2016 | Arora | G11C 7/04 365/189.16 |
| 2016/0116924 A1* | 4/2016 | Meijer | G05F 1/462 327/143 |
| 2016/0147467 A1* | 5/2016 | Roberts | G06F 12/0238 711/103 |
| 2016/0187018 A1* | 6/2016 | Honma | G06F 9/5094 700/276 |
| 2016/0266819 A1* | 9/2016 | Sundell | G06F 1/26 |
| 2017/0131947 A1* | 5/2017 | Hoang | G06F 11/00 |
| 2017/0131948 A1* | 5/2017 | Hoang | G06F 3/0653 |
| 2017/0199769 A1* | 7/2017 | Jain | G06F 11/008 |
| 2017/0256305 A1* | 9/2017 | Niu | G06F 12/023 |
| 2017/0285970 A1* | 10/2017 | Li | G06F 3/0653 |
| 2017/0299650 A1* | 10/2017 | Coyne | G01R 31/2879 |
| 2017/0371719 A1* | 12/2017 | Majumdar | G06F 9/5094 |
| 2018/0129243 A1* | 5/2018 | Park | G06F 11/3024 |
| 2018/0159543 A1* | 6/2018 | Seo | H03L 7/0814 |
| 2018/0189135 A1* | 7/2018 | Naik | G11C 16/26 |
| 2018/0239641 A1* | 8/2018 | Kumar | G06F 9/5027 |
| 2018/0267705 A1* | 9/2018 | Liu | G06F 3/061 |
| 2019/0051363 A1 | 2/2019 | Raasch et al. | |

OTHER PUBLICATIONS

K. Kang, J. Kim, S. Yoo and C. Kyung, "Runtime Power Management of 3-D Multi-Core Architectures Under Peak Power and Temperature Constraints," in IEEE Transactions on Computer-Aided Design of Integrated Circuits and Systems, vol. 30, No. 6, pp. 905-918, Jun. 2011. (Year: 2011).*

M. Ciappa, "Lifetime Modeling and Prediction of Power Devices," 5th International Conference on Integrated Power Electronics Systems, 2008, pp. 1-9. (Year: 2008).*

M. N. Islam and S. Kundu, "An analytical model for predicting the residual life of an IC and design of residual-life meter," 2017 IEEE 35th VLSI Test Symposium (VTS), May 18, 2017, pp. 1-6, doi: 10.1109/VTS.2017.7928938. (Year: 2017).*

S. S. Kumar, A. Zjajo and R. van Leuken, "Fighting Dark Silicon: Toward Realizing Efficient Thermal-Aware 3-D Stacked Multiprocessors," in IEEE Transactions on Very Large Scale Integration (VLSI) Systems, vol. 25, No. 4, pp. 1549-1562, Apr. 2017, doi: 10.1109/TVLSI.2016.2642587. (Year: 2017).*

U.S. Patent and Trademark Office; Non-Final Office Action; U.S. Appl. No. 15/857,887; dated Feb. 7, 2019.

U.S. Patent and Trademark Office; Final Office Action; U.S. Appl. No. 15/857,887; dated Jul. 10, 2019.

U.S. Patent and Trademark Office; Non-Final Office Action; U.S. Appl. No. 15/857,887; dated Nov. 29, 2019.

U.S. Patent and Trademark Office; Final Office Action; U.S. Appl. No. 15/857,887; dated Apr. 2, 2020.

U.S. Patent and Trademark Office; Non-Final Office Action; U.S. Appl. No. 15/857,887; dated Oct. 29, 2020.

U.S. Patent and Trademark Office; Final Office Action; U.S. Appl. No. 15/857,887; dated Apr. 1, 2021.

U.S. Patent and Trademark Office; Non-Final Office Action; U.S. Appl. No. 15/857,887; dated Aug. 19, 2021.

* cited by examiner

METHOD AND APPARATUS FOR PROVIDING THERMAL WEAR LEVELING

GOVERNMENT LICENSE RIGHTS

This invention was made with Government support under PathForward Project with Lawrence Livermore National Security (Prime Contract No. DE-AC52-07NA27344, Subcontract No. B620717) awarded by the Department of Energy (DOE). The Government has certain rights in this invention.

BACKGROUND OF THE DISCLOSURE

Integrated circuits are used in computing devices such as, but not limited to, smart phones, tablets, wearables, laptops, desktops, internet servers, printers, and other devices. Some integrated circuits that include processors such as central processing units (CPUs), graphics processing units (GPUs), or other logic units such as arithmetic logic units (ALUs), and memories such as random access memories (RAMs) and other memory devices employ a network of temperature sensors that are monitored by thermal control logic that may be located on die with the components being monitored or may be off die. Monitoring of the temperatures of various components or integrated circuit die regions allows thermal control logic to change operating frequencies of the processors, or reroute memory mapping in memories to avoid creating hot spots on an integrated circuit. Typically these known systems provide short term based temperature monitoring. For example, integrated circuits may be packaged in any suitable manner including stacking of dies in a common package to form a three dimensional stacked package or may be configured in a two dimensional manner. Known systems attempt to use the temperature sensors to detect hot spots in integrated circuit regions and if the circuit region is a memory device, for example, the thermal control logic may map memory accesses to other memory regions that are not determined to be hot spots. However, this is typically done using short term temperature data which is then reset upon power down or during power reduction conditions. Similarly, the control of processors is also carried out using distributed thermal sensors so that in a multi-core processor, for example, different cores that are detected to be overly hot are controlled by changing frequency operation, or execution threads are moved to cooler cores. However, as with the memory thermal leveling systems, the workload leveling systems also use short term temperature data which is then reset upon power down or is reset in power reduction modes.

As such, task executions including memory accesses (read and/or write accesses) as well as thread execution operations in processors, are controlled based on short term thermal temperature information which is typically reset upon an integrated circuit being powered down. However, long-term thermally accelerated faults can be exhibited via several mechanisms such as negative biased temperature instability (NBTI) and electromigration. Where multiple components such as logic or memory dies have thermal coupling, such as when they are integrated in a 3D package or otherwise located within proximity of one another, the hot components may cause long term wear-out for themselves and nearby components.

It would be desirable to have an improved thermal spreading mechanism for die regions and/or among dies of integrated circuits.

BRIEF DESCRIPTION OF THE DRAWINGS

The disclosure will be more readily understood in view of the following description when accompanied by the below figures and wherein like reference numerals represent like elements, wherein.

DETAILED DESCRIPTION OF EMBODIMENTS

Exemplary embodiments provide thermal wear spreading among a plurality of thermal die regions in an integrated circuit or among dies by using die region wear-out data that represents a cumulative amount of time each of a number of thermal die regions in one or more dies has spent at a particular temperature level. In one example, die region wear-out data is stored in persistent memory and is accrued over a life of each respective thermal region so that a long term monitoring of temperature levels in the various die regions is used to spread thermal wear among the thermal die regions. In one example, spreading thermal wear is done by controlling task execution such as thread execution among one or more processing cores, dies and/or data access operations for a memory.

In one example, an apparatus includes at least one integrated circuit having a plurality of thermal die regions. Temperature sensors produce temperature data associated with the plurality of thermal die regions. Thermal wear spreading logic uses the temperature data to produce die region wear-out data representing a cumulative amount of time each of the plurality of thermal die regions has spent at a temperature level based on the temperature data. The thermal wear spreading logic spreads thermal wear among the plurality of thermal die regions by controlling task execution among the plurality of thermal die regions using the die region wear-out data.

In some embodiments, the thermal wear spreading logic stores, in persistent memory, the die region wear-out data and the thermal wear spreading logic spreads thermal wear among the plurality of thermal die regions by generating wear out control data that controls another or both of thread execution among a plurality of processing cores or remapping of memory addresses for a die region of memory. In one example, the thermal wear spreading logic accrues the temperature data over the life of each respective thermal region of the plurality of thermal regions.

In one example, the temperature level includes a plurality of temperature ranges and the die region wear-out data includes data representing a cumulative amount of time each of the plurality of thermal die regions has spent in each of the plurality of temperature ranges. In one example, the thermal wear spreading logic generates the wear out control data by combining the cumulative amount of time each of the plurality of thermal die regions has spent in each of the plurality of temperature ranges.

In another example, the thermal wear spreading logic spreads thermal wear among the plurality of thermal die regions based on temperature data that is not accumulated over the life of a respective thermal region and is operative to prioritize the spreading of thermal wear among the plurality of thermal die regions based on temperature data that is not accumulated over the life of a respective thermal region over the spreading of thermal wear among the plurality of thermal die regions using the die region wear-out data.

In one example, the thermal wear spreading logic categorizes each of the plurality of die regions into a wear-out level based on the die region wear-out data, orders threads in a manner indicative of an amount of heat a thread is determined to cause when executing, and assigns threads such that a thread causing a lower amount of heat is assigned to a die region having a higher wear-out level with respect to another die region.

In one example, the thermal wear spreading logic determines die region wear-out data by combining die region wear-out data from multiple temperature ranges and spreads thermal wear among the plurality of thermal die regions by controlling task execution among the plurality of thermal die regions using the die region wear-out level data.

In another example, an apparatus includes at least one integrated circuit package having a plurality of stacked dies each with a plurality of thermal die regions. The apparatus includes temperature sensors that provide temperature data associated with the plurality of thermal die regions. The apparatus includes persistent memory such as non-volatile RAM, a hard drive or other persistent memory. The apparatus also includes the thermal wear spreading logic that uses the temperature data to produce die region wear-out data representing a cumulative amount of time each of the plurality of thermal die regions has spent in each of a plurality of temperature ranges based on the temperature data and spreads thermal wear among the plurality of thermal die regions by controlling task execution among the plurality of thermal die regions using the die region wear-out data. The thermal wear spreading logic stores, in the persistent memory, the die region wear-out data. The thermal wear spreading spreads thermal wear among the plurality of thermal die regions by generating wear out control data that controls at least one of: thread execution among a plurality of processing cores and remapping of memory addresses for a die region of memory.

A method for providing thermal wear spreading among a plurality of thermal die regions in an integrated circuit includes producing, such as by thermal control logic, die region wear-out data representing a cumulative amount of time each of the plurality of thermal die regions has spent at a temperature level based on temperature data from each of the plurality of die regions and spreading thermal wear among the plurality of thermal die regions by controlling task execution among the plurality of thermal die regions using the die region wear-out data.

In one example, the method includes storing, in persistent memory, the die region wear-out data and wherein spreading thermal wear among the plurality of thermal die regions includes generating wear out control data that controls at least one of: thread execution among a plurality of processing cores and remapping of memory addresses for a die region of memory.

In one example, the die region wear-out data is based on temperature data accrued over the life of each respective thermal region of the plurality of thermal regions. Also, in one example, the temperature level includes a plurality of temperature ranges and wherein the die region wear-out data includes data representing a cumulative amount of time each of the plurality of thermal die regions has spent in each of the plurality of temperature ranges. Also, the method includes generating the wear out control data by combining the cumulative amount of time each of the plurality of thermal die regions has spent in each of the plurality of temperature ranges.

In one example, the method includes prioritizing a short term thermal spreading operation over long term thermal spreading operations. For example, the method includes spreading thermal wear among the plurality of thermal die regions based on temperature data that is not accumulated over the life of a respective thermal region and prioritizing the spreading of thermal wear among the plurality of thermal die regions based on temperature data that is not accumulated over the life of a respective thermal region over the spreading of thermal wear among the plurality of thermal die regions using the die region wear-out data.

In one example, the method includes categorizing each of the plurality of die regions into a wear-out level based on the die region wear-out data, and ordering threads in a manner indicative of an amount of heat a thread is determined to cause when executing. The method includes spreading thermal wear among the plurality of thermal die regions using the die region wear-out data by assigning threads such that a thread causing a lower amount of heat is assigned to a die region having a higher wear-out level with respect to another die region.

In another example, the method includes determining die region wear-out level data by combining die region wear-out data from multiple temperature ranges and wherein spreading thermal wear among the plurality of thermal die regions includes controlling task execution among the plurality of thermal die regions using the die region wear-out level data.

Figure 1:
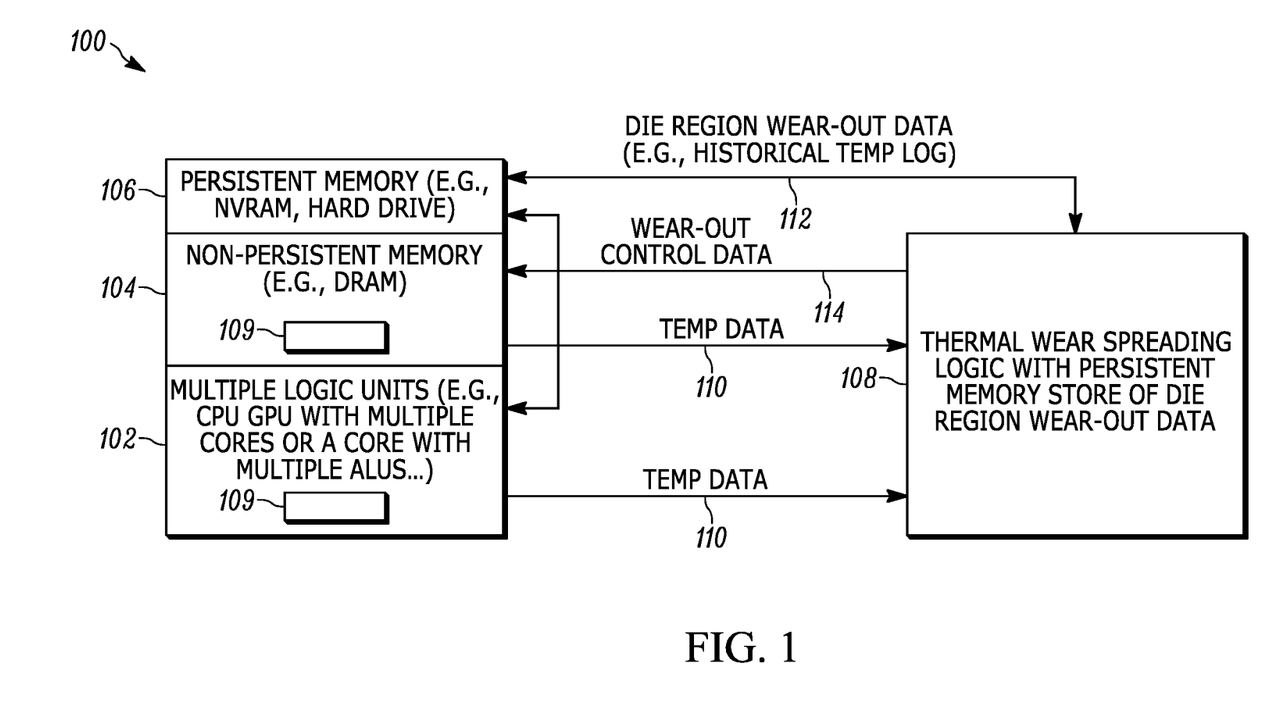
FIG. 1 is a block diagram illustrating an apparatus that provides thermal wear spreading among a plurality of thermal die regions in accordance with one example set forth in the disclosure.

FIG. 1 illustrates an example of an apparatus 100 such as, but not limited to, a server, smart phone, tablet, wearable device, printer, game console, or any other suitable device that employs integrated circuits. In this example, the apparatus includes one or more integrated circuits 102 that include processing cores such as central processing unit (CPU) cores, graphics processing unit (GPU) cores, a combination thereof or any other suitable cores that execute programmable instructions. The integrated circuit may also include arithmetic logic units (ALUs). In addition, the apparatus includes non-persistent memory 104 such as dynamic RAM (DRAM) or any other suitable non-persistent memory which may also be an integrated circuit die which is die stacked with the integrated circuit 102. The apparatus also includes persistent memory 106 such as non-volatile RAM (NVRAM) that may be implemented as an integrated circuit also stacked with the integrated circuit 102 and 104 or may be a hard drive, or any other persistent memory that stores data when power is removed from the persistent memory.

The apparatus 100 also includes thermal wear spreading logic 108 that is implemented as a programmable controller, state machine, or any other suitable logic that may be separate from or integrated with any of the integrated circuits 102, 104 and 106. Each of the integrated circuits 102 and 104 include distributed temperature sensors 109 configured to sense temperature of various die regions as known in the art. The temperature sensors 109 provide temperature data 110 to the thermal wear spreading logic 108. This may take any suitable form including a push or pull operation, storing the temperature data in registers or memories that is then accessed by the thermal wear spreading logic 108, or any other suitable technique.

The thermal wear spreading logic 108 produces die region wear-out data 112 from the temperature data 110, representing a cumulative amount of time each of the thermal die regions have spent at a temperature level. For example, the die region wear-out data 112 which in one example is a historical temperature log of the amount of time a thermal die region has spent in one or more different temperature ranges. For example the die region wear-out data 112 shows that a CPU core has spent several weeks or months at a temperature level of 100 degrees Celsius or higher. This die region wear-out data 112 is accumulated and stored in persistent memory 106 so that it is not lost during power downs and is considered long term information that is used to determine whether native biased temperature instability and electromigration is occurring on a per thermal region or per die basis. In one example, the thermal control logic 108 compares the die region wear-out data 112 to die region wear-out threshold data that may be provided by a manufacturer of the die or determined through testing so that if die region wear-out data exceeds the threshold data, the die region is considered to have too high of a wear-out level and spreading from the die region to a cooler region occurs (see e.g., FIG. 5).

In another example, as further described below, die region wear-out data 112 instead of being a historical temperature log for a given die region that represents a cumulative amount of time that a die region has spent at a temperature level, may instead be a summation of the amount of time that a thermal die region has spent at a temperature level where the temperature level is a single temperature range or plurality of ranges (see e.g., FIG. 5). In one example, each die region is tracked to determine how long it has been operating in a specific temperature range. This data is accumulated from the initial power on of the respective integrated circuit.

When an undesirable level of wear-out is detected for a thermal die region, the thermal control logic 108 generates wear-out control data 114 to spread thermal wear among die regions (including between dies). The wear-out control data 114 is used to spread thermal wear among the plurality of thermal die regions by (including between dies), for example, controlling task execution among the plurality of die regions based on the die region wear-out data 112. The wear-out control data 114 causes, for example, a different processing core to execute a given thread such as one that is cooler (i.e., less wear-out) than another processing core. In another example, another task execution that is carried out in response to the wear-out control data 114 is a memory access remapping so that read or write operations are moved to different memory locations either across integrated circuits or within different memory banks of a same die memory.

Figure 2:
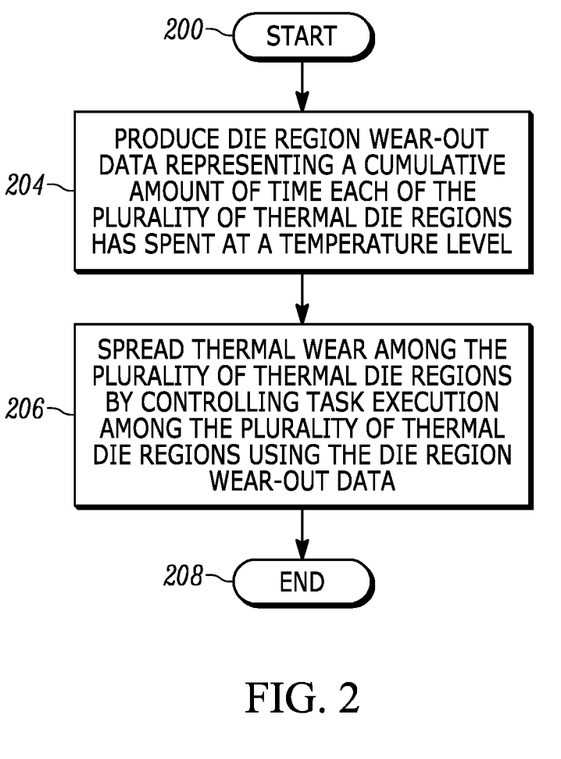
FIG. 2 is a flowchart illustrating a method for providing thermal wear spreading among the plurality of thermal die regions in an integrated circuit in accordance with one example set forth in the disclosure.

Referring also to FIG. 2, a method for providing thermal wear spreading among the plurality of thermal die regions is illustrated. The method is carried out by the thermal wear spreading logic 108 in one example. As shown in block 200, the method begins by, for example, accumulating temperature data 110 from multiple die regions from one or more dies using temperature sensors 109. As shown in block 204, the method includes producing die region wear-out data 112. The die region wear-out data 112 represents a cumulative amount of time that each of the plurality of thermal die regions has spent at a relevant temperature level, based on the temperature data 110. In one example, the die region wear-out data 112 includes a historical temperature log for each thermal die region that is monitored, or a subset thereof. In one example the temperature data 110 is accrued over the life of each respective thermal region of the plurality of thermal regions. For example, the die region wear-out data 112 is maintained in the persistent memory 106 for multiple thermal die regions even after a power shut off condition corresponding to those thermal die regions has occurred. As such, if a die that includes CPU cores, GPU cores or other logic units have been powered down, the die region wear-out data 112 that has been recorded is maintained in the persistent memory 106. This data is accumulated over the life of the die or integrated circuit so that it can be determined when to replace a particular die or integrated circuit before it fails.

In one example, the temperature data 110 that is used is based on a threshold such that the temperature level can be a predetermined level such as 100 degrees Celsius or any other suitable level above which the thermal wear spreading logic 108 records the amount of time that a thermal die region spends at or above the temperature level. As used herein, temperature level also includes a single temperature range, multiple temperature ranges or a single temperature if desired. In another example, the die region wear-out data 112 is calculated and stored as an average temperature that is measured from the temperature data 110 over a period of time, so the thermal wear spreading logic 108, determines how long on average a particular thermal die region has spent at (which includes above or below a threshold) a particular temperature level, including, for example, within one or more temperature ranges or beyond a temperature threshold.

As shown in block 206, the method includes spreading thermal wear among the plurality of thermal die regions by controlling task execution among the plurality of thermal die regions using the die region wear-out data. Task execution includes any suitable operation that reduces wear-out for a die or die region and in one example includes changing cores or logic units that executes threads, changing memory locations that are used, changing an operating frequency of a core or logic unit, changing an operating voltage of a core, memory or logic unit, or any other suitable operation that reduces wear-out. The method in one example, also includes storing, in the persistent memory 106, the die region wear-out data 112 so that it can be accumulated over the life of a particular die or thermal die region. The method also includes spreading of the thermal wear among the plurality of thermal die regions by generating the wear-out control data 114 to control thread execution among the plurality of processing cores, remapping of memory addresses for a die region of memory, or any combination thereof or other operations. The method repeats as shown in block 208 as needed to continually monitor for wear-out conditions.

Figure 3:
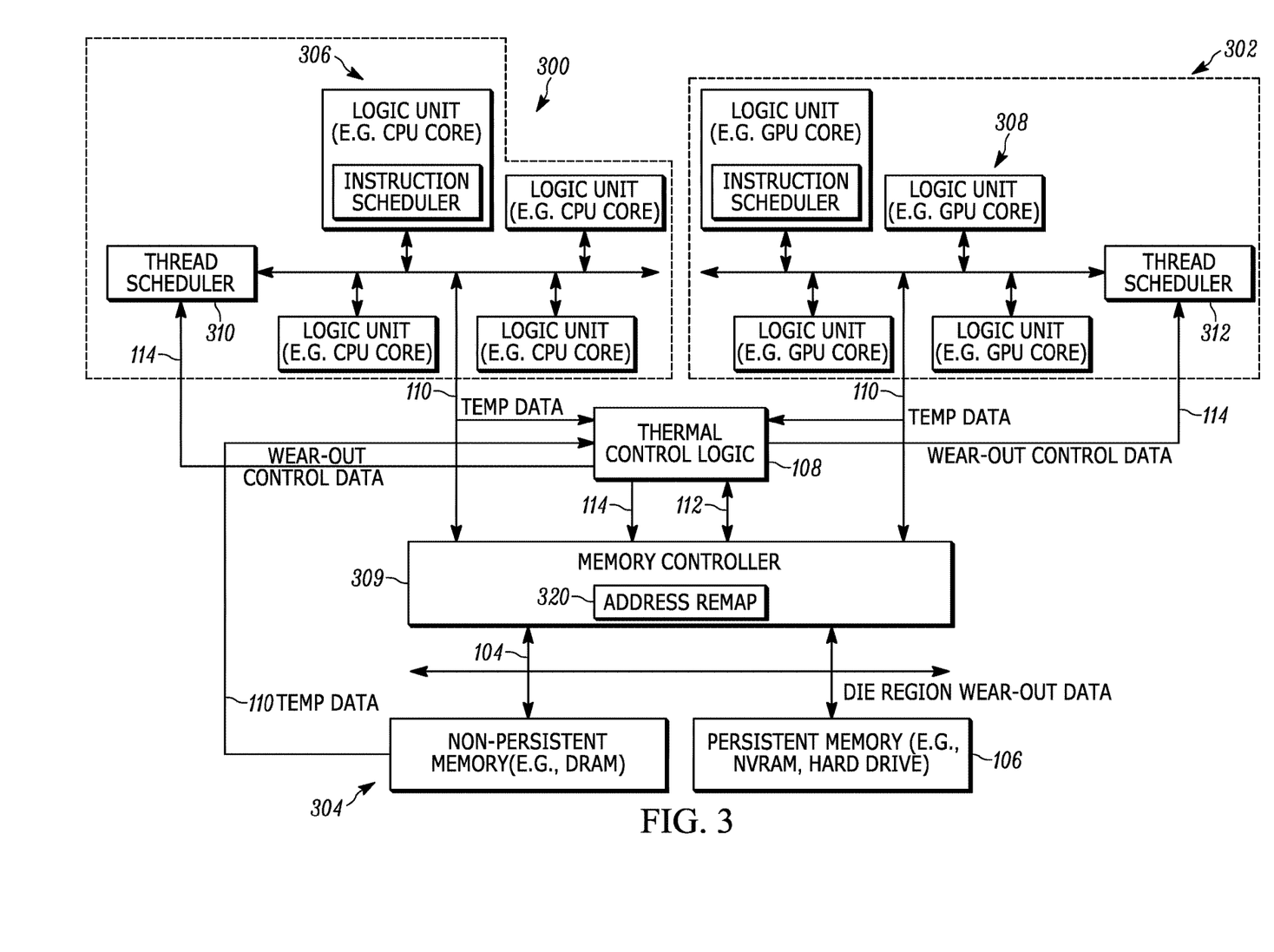
FIG. 3 is a block diagram illustrating an apparatus that employs thermal wear spreading operation in accordance with one example set forth in the disclosure.
Figure 4:
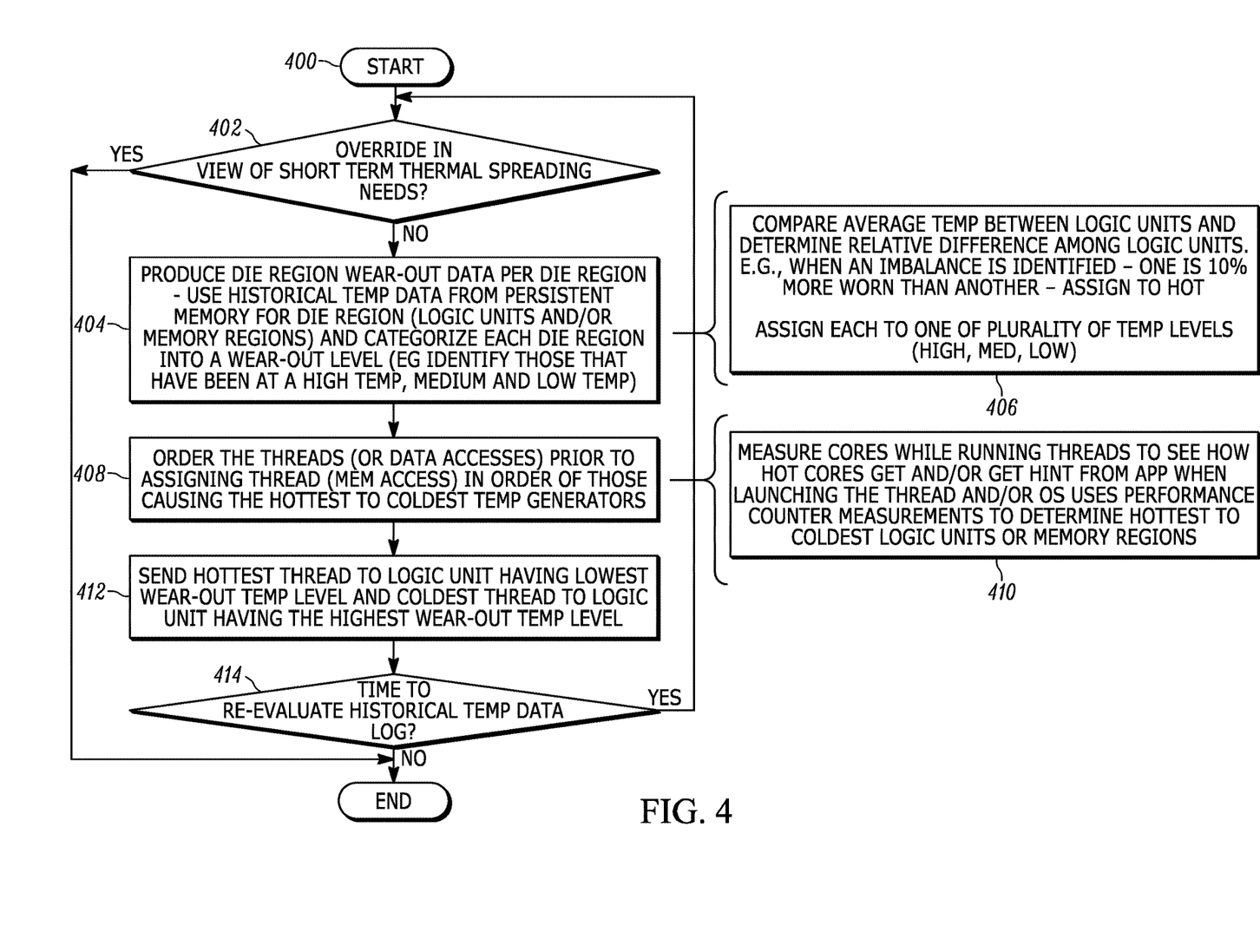
FIG. 4 is a flowchart illustrating a method for providing thermal wear spreading in accordance with one example set forth in the disclosure.
Figure 5:
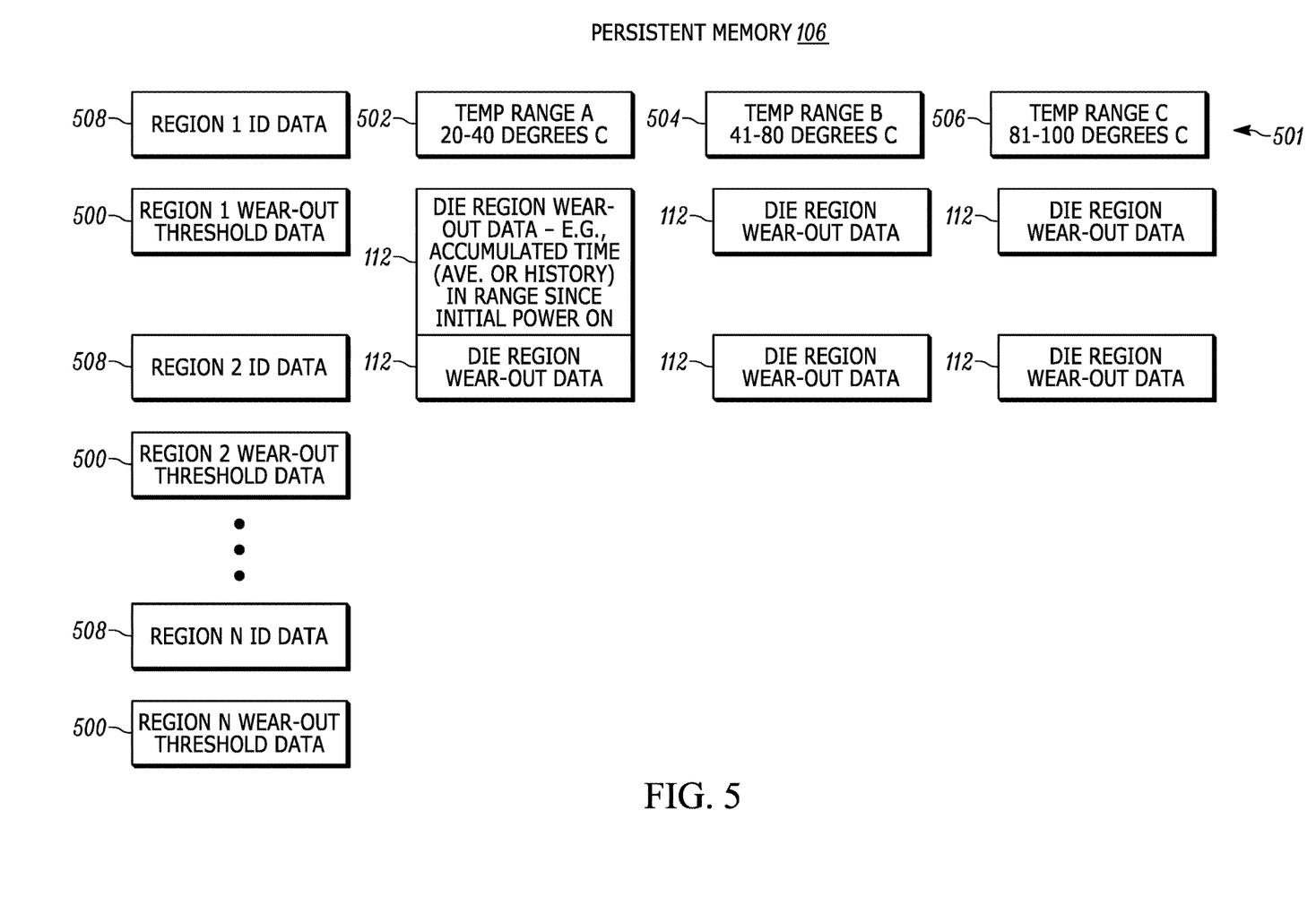
FIG. 5 is a block diagram illustrating data stored in persistent memory in accordance with one example set forth in the disclosure.

Referring to FIGS. 3-5, an example of the apparatus 100 includes a first processor 300, such as a CPU die, a second processor 302 such as a GPU die, a memory die 304 that includes the non-persistent memory. It will also be recognized that the various operations may be combined in a single die or the apparatus may include other dies which are in a 3D stacked architecture or in any other suitable format. The CPU die includes a plurality of logic units 306 such as a plurality of CPU cores. Similarly, the GPU die includes a plurality of logic units 308 including GPU cores. A thread scheduler 310 routes threads to the various CPU cores and thread scheduler 312 routes threads to the various GPU cores. As used herein a processor is logic that executes executable instructions including a core. Temperature data 110 from distributed temperature sensors 109 on the various CPU cores, GPU cores and thermal die memory regions 104 are provided to the thermal control logic 108 as previously illustrated in FIG. 1. The dies 300, 302 and 304 are considered integrated circuits each having a plurality of thermal die regions. Temperature sensors 109 are coupled to the plurality of thermal die regions, as known in the art, and provide temperature data 110 associated with the plurality of die regions. The thermal wear spreading logic 108 produces die region wear-out data 112 that is stored in the persistent memory 106.

For example, when the thermal wear spreading logic 108 determines that a particular thermal die region has been operating for the period of time at a temperature level that is beyond a die region wear-out threshold, the thermal wear spreading logic 108 issues the wear-out control data 114 to control the appropriate task operation to spread thermal wear to other thermal die regions that can accommodate the task. By way of example, the wear-out control data 114 instructs a thread scheduler (310 or 312) of a processor 306 or 308 to route threads from one processing core that is beyond a desired amount of time at a temperature level to a core that has less wear-out (a cooler temperature profile). It will be recognized that the thread schedulers and thermal control logic 108 can be implemented as part of an operating system or other software executing on one or more processors.

If the task relates to a memory access task such as a write operation to memory, in another example, the wear-out control data 114 is communicated to a memory controller 309 which remaps the memory addresses to a memory region having less wear-out compared to the region determined to have an undesirable amount of wear-out. The thermal control logic 108 or memory controller 309 employs a data remap table 320 or software page tables to remap memory accesses to different regions of memory that have a lower amount of determined wear-out level to spread the thermal wear to die regions that have a lower amount of die region wear-out. It will be recognized that override options may also be desirable to override a thermal wear leveling controller's execution unit for certain threads. For example, it may be more important for the system to be able to execute a given thread even if the wear-out level is at a "high" level. The method spreads out thermal wear among differing dies in a stacked arrangement or within a die as desired.

Stated another way, the thermal control logic 108 issues the wear-out control data 114 to the memory controller 309 which causes the address remap operation 320 to remap memory addresses to cooler memory banks that have a lower wear-out level. The thermal control logic 108 issues the wear-out control data 114 to the appropriate thread scheduler 310 or 312 when threads need to be rescheduled to processing cores that have a lower wear-out level compared to a processing core that has a high wear-out level as determined by the thermal control logic 108 using the die region wear-out data 112.

Referring also to FIG. 5, in one example, the temperature level 501 includes a plurality of temperature ranges as opposed to, for example, a single range or a particular temperature. For example, the thermal wear spreading logic 108 tracks how long (e.g., days, weeks, months) a particular die region has spent at a temperature level 501, in this example, in a temperature range 502, for example, of 20-40 degrees Celsius, how long that same die region has spent in the temperature range 504 of 41-80 degrees Celsius and how long the thermal die region spent over its life in the temperature range 506 of 81-100 degrees Celsius. However, any suitable number of ranges and temperature ranges may be employed. The thermal wear spreading logic 108 then combines the die region wear-out data 112 corresponding to each of the temperature ranges for a particular die region identified by die region identification data 508 and hence generates wear-out control data 114 by combining a cumulative amount of time each of the plurality of thermal die regions has spent in each of the plurality of temperature ranges to produce wear-out level data 601. This is generally represented by the equation below where (w) represents weighting if desired:

$$\text{Wear-out level data\_Reg } n = \Sigma(\text{Range } A)(w1) + (\text{Range } B)(w2) + (\text{Range } C)(w3)$$

and comparing the combined amount to the wear-out threshold data 500. In another example, where the die region wear-out data 112 is a thermal log of cumulative temperature changes over different times (different time stamps), the thermal control logic 108 instead calculates a rate of change of temperature to determine whether wear-out exists. For example when the rate of temperature change of a die region exceeds a rate of change wear-out threshold, the thermal control logic 108 controls task execution to avoid the thermal die region that has exhibited an abnormal rate of change of temperature.

The disclosed wear-out based thermal spreading technique described herein can be combined with conventional short term thermal spreading operations—those that do not accumulate temperature data over life of thermal regions to provide a more robust thermal spreading system. For example, as shown in FIG. 4, a method of providing thermal wear spreading among the plurality of thermal die regions begins in block 400 and in block 402, the thermal wear spreading logic 108 determines if a conventional short term thermal spreading operation should override thermal wear spreading based on wear-out data. For example, if a thermal die region is exceeding its critical temperature, the short term thermal spreading operation in the logic 108 will take appropriate action to avoid the overheating of the thermal region, such as spreading threads if the thermal die region is in a processing core or remap memory addresses to a cooler memory region if a particular memory bank is getting too hot. In this example, the wear-out control data 114 does not have to be issued since the integrated circuit may be operating under conditions in the short term that need resolution immediately. As such, the thermal wear spreading logic 108 may use a conventional thermal spreading operation to spread thermal wear among the plurality of thermal die regions based on temperature data that is not accumulated over the life of the respective thermal region.

As shown in block 404, if no thermal spreading is required using conventional short term based thermal spreading techniques, the method includes producing die region wear-out data per die region that represents a cumulative amount of time that each die region has spent at a temperature level. For purposes of example only, the die region will, by way of example, be a processing core and spreading the thermal wear will be the controlling of thread execution. As noted above, the die region wear-out data 112 in one example is a historical log that represents a cumulative amount of time each of a plurality of die regions has spent at a temperature level wherein a temperature level may be at a single temperature, a single temperature range, a plurality of ranges of temperatures or any other suitable designation as desired.

The method includes categorizing each of the plurality of die regions into a wear-out level, such as a high wear-out level, medium wear-out level or low wear-out level or any other suitable categories, based on the die region wear-out data 112. For example, as shown in block 406, categorizing each die region into a wear-out level includes in one example, comparing the average temperature between CPU cores on a CPU die and determining the relative temperature difference among the cores. For example, when an imbalance is identified such as when one processing core is 10% more worn than another core, it is categorized as a high wear-out core such that future threads are routed to other cores until their wear-out level increases to the same level. As another example, each die region may be assigned to a high, medium, low temperature category such that the cumulative amount of time that each thermal die region spends at a high temperature, medium temperature and low temperature is recorded. When a die region is determined to have spent an undesirable time at high temperature it is designated as a highly worn region where after threads are assigned through other less worn cores. Any other suitable techniques to determine levels of wear-out may also be utilized.

As shown in block 408, the method also includes ordering threads in a manner indicative of an amount of heat a thread is determined to cause when executing. For example, as noted in block 410, ordering of the threads includes measuring processing cores while running threads to see how hot cores get. The thermal control logic 108, an operating system, application or other software may also perform the operation. As an alternative, an application provides hints to the thermal control logic 108 and/or operating system or other component which can indicate that a particular application has code that causes a particular core to run at a high temperature. Other techniques may include using performance counter information or other measurements to determine the hottest and coldest logic units or memory regions, as desired.

As shown in block 412, the method includes sending the thread that causes the hottest temperature to a logic unit (e.g., core) having a lowest wear-out temperature level (considered a low wear-out category) and assigning threads such that the thread causing the lower amount of heat is assigned to a die region have a higher wear-out level with respect to another die region. Likewise, thermal spreading will include using the die wear-out data to assign threads such that the thread causing a high amount of heat is assigned to a die region having a lower wear-out level with respect to another die region.

As shown in block 414, the method includes determining whether it is time to reevaluate the historical temp log data which is the die region wear-out data 112 in this example. For example, temperature data is updated on a periodic basis so that once threads are reassigned to regions that have less wear-out, it may be necessary to reevaluate the die region wear-out data 112 that is being accumulated to determine whether reassignment is necessary for other regions or the current die region.

Figure 6:
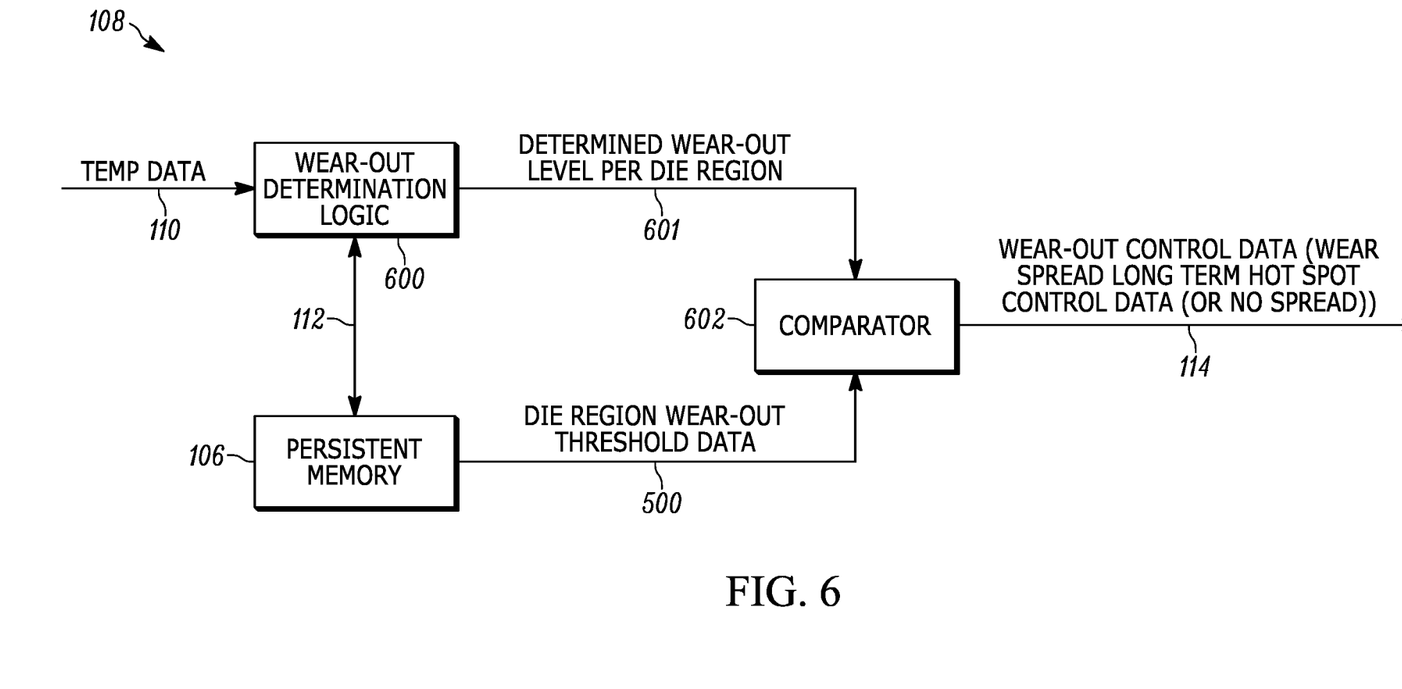
FIG. 6 is a block diagram illustrating one example of thermal wear spreading logic in accordance with the disclosure.

FIG. 6 is a block diagram illustrating one example of the thermal control logic 108. As noted above, the thermal control logic 108 in one example is a suitably programmed processor, however it may also be a state machine or any other suitable logic and may be centralized or distributed on the die for which it is controlling thermal wear or may control thermal wear among other dies. In this example, the thermal control logic 108 includes wear-out determination logic 600, and a comparator 602. The wear-out determination logic 600 receives the temperature data 110 and using the temperature data, produces the die region wear-out data representing a cumulative amount of time each of the plurality of thermal die regions has spent at a temperature level. Counters are used to accumulate how long each die region spreads in a particular temperature range. As noted above with respect to FIG. 5, in one example the wear-out determination logic 108 generates the wear-out level data 601 per die region. The comparator 602 receives the wear-out level data 601. The wear-out determination logic 600 also causes the die region wear-out threshold data 500 for the particular die region to be provided to the comparator 602 using the region ID data 508. The comparator 602 compares the wear-out level data 601 to the die region wear-out threshold data 500. In one example, if the wear-out level data 601 exceeds the die region threshold data 500, then the comparator 602 generates the wear-out control data 114 to cause the spreading of thermal wear among the plurality of thermal die regions as previously noted above.

The above apparatus and method provide a mechanism to measure, monitor and control thermal-induced wear-out, where the control mechanisms spread out the thermal wear to multiple components and if desired, among all areas of all components where possible, attempting to maximize the overall system lifetime before integrated circuits or packages need to be replaced. One of the many advantages that results includes increasing the life of independent devices such as memory stacked vertically above a GPU die. For example, the above operations can increase the lifetime of packages that tightly integrate memory with CPUs, GPUs, APUs or other processing units. Data centers with super computers will have improved lifetime of integrated circuits. Better energy efficiency and performance can be achieved without a negative effect of increased temperatures over long periods of time.

In one example, for each thermal die region, a persistent memory, such as flash, NVRAM, hard disk, PCM or other NVM, store the amount of time each die region spends in a desired temperature range. This information is used by thermal control logic 108 for thermal wear leveling. Thermal wear leveling spreads out a thermal profile of each die region including over multiple dies if desired, over time such as on the order of weeks or other suitable time frame. Monitoring and logging of time spent at each temperature is recorded at a much finer granularity, if desired especially if integrated circuit die activity creates transient hot spots.

When making task schedule decisions, the thermal control logic 108 causes a scheduling control mechanism such as an operating system, thread scheduler, instruction scheduler or other mechanism to attempt to schedule the most power consuming task to the least thermally worn out die region (such as memory, ALU, core or other die region). Over time, the scheduling attempts to equal wear-out in each region. This serves to maximize the time before failure of any single part of the system, thereby maximizing a lifetime of the integrated circuit, stacked dies, or IC package.

It is contemplated that the components that are thermally coupled may have separate thermal controllers. For example, a GPU die vertically stacked with a memory die may have its own thermal controller, a memory such as DRAM or other memory may have its own thermal controller and a CPU die vertically stacked over memory may have its own memory controller. As such, a distributed thermal controlled system is contemplated as well as a centralized thermal control system. Distributed systems can negotiate management of activities on each die so that, for example, operations slated for one die may be scheduled to operate on another die that has less wear-out. It is also contemplated that certain components may have more control over the control of dynamic thermal profiling and would be the main decision makers. For example, in a GPU die with vertical memory die stacking, the GPU would be the main decision maker, but not exclusive decision maker if desired, as the memory die could rearrange its configuration as well using die memory mapping. Other arrangements will also be recognized by those of ordinary skill in the art.

In other examples, there may be two or more dies, such as a GPU die over another GPU die that have similar thermal profile control capabilities, that negotiate which die reduces heat generation in certain regions and that die is used to level out the thermal wear. A protocol for exchanging of thermal and performance cost information between coupled dies may also be employed. Thermal profile information may be combined with fault detection information in order to anticipate the occurrence of hard failures. For example, the thermal control logic is configured to anticipate when a fault will occur for one of the regions or dies using error rates reported from hardware and detected using error detection codes (EDC) or logic timing failures using timing error detection using ring oscillators. If the error rates or logic timing delays exceed a threshold, thermal wear mitigation actions may be triggered. The profile information is related to local or system level scheduling entities in order to avoid system downtime.

Spreading of the thermal wear among a plurality of thermal die regions may be done in a hardware configuration for example, such as a CPU or GPU instruction scheduler choosing which compute units to use for particular instructions or work groups by selecting a processing core and assigning threads to the core such that a thread causing the lower amount of heat is assigned to a die region having a higher wear-out level with respect to another die region. In another example, an operating system may use its thread scheduler to decide which compute units to map the threads to in a similar manner.

The above detailed description and the examples described therein have been presented for the purposes of illustration and description only and not for limitation. For example, the operations described may be done in any suitable manner. It is therefore contemplated that the present embodiments cover any and all modifications, variations or equivalents that fall within the scope of the basic underlying principles disclosed above and claimed herein. Furthermore, while the above description describes hardware in the form of a processor executing code, hardware in the form of a state machine or dedicated logic capable of producing the same effect, other structures are also contemplated.

What is claimed is:

1. A method for providing thermal wear spreading among a plurality of thermal die regions in an integrated circuit the method comprising:
   producing die region wear-out data representing a cumulative amount of time each of the plurality of thermal die regions has spent at a temperature level, based on temperature data from each of the plurality of thermal die regions;
   storing, in persistent memory, the die region wear-out data;
   determining if a short term spreading operation based on operating condition data that is not accumulated over a life of a respective thermal region should override a thermal wear spreading operation that is based on the die region wear-out data that is accumulated over the life of the respective thermal region; and
   when an override condition is met, spreading thermal wear among the plurality of thermal die regions based on operating condition data that is not accumulated over the life of a respective thermal region when an override condition exists.

2. The method of claim 1, wherein the die region wear-out data is based on temperature data accrued over the life of each respective thermal region of the plurality of thermal die regions.

3. The method of claim 1 wherein:
   the temperature level includes a plurality of temperature ranges;
   the die region wear-out data including data representing a cumulative amount of time each of the plurality of thermal die regions has spent in each of the plurality of temperature ranges; and
   generating wear out control data by combining the cumulative amount of time each of the plurality of thermal die regions has spent in each of the plurality of temperature ranges.

4. The method of claim 1, further comprising:
   determining die region wear-out level data by combining die region wear-out data from multiple temperature ranges; and
   wherein spreading thermal wear among the plurality of thermal die regions includes controlling task execution among the plurality of thermal die regions using the die region wear-out level data.

5. The method of claim 1, further comprising wherein spreading thermal wear among the plurality of thermal die regions includes remapping of memory addresses for a die region of memory.

6. The method of claim 1, wherein:
   producing die region wear-out data includes:
      categorizing each of the plurality of thermal die regions into a wear-out level based on the die region wear-out data;
      ordering threads in a manner indicative of an amount of heat a thread is determined to cause when executing; and
      spreading thermal wear among the plurality of thermal die regions using the die region wear-out data comprises assigning threads such that a thread causing a lower amount of heat is assigned to a die region having a higher wear-out level with respect to another die region.

7. The method of claim 1 comprising:
   producing fault detection information indicating that a number of faults has occurred beyond a desired threshold;
   storing, in persistent memory, the number of faults that has occurred beyond a desired threshold;
   anticipating when a fault will occur based on at least both the cumulative die region wear-out data and based on the fault detection information indicating the number of faults that has occurred beyond the desired threshold; and
   wherein producing fault detection information comprises producing data indicating at least one of: an error rate exceeds a threshold or logic timing delays exceed a threshold.

8. An apparatus, comprising:
at least one integrated circuit having a plurality of thermal die regions;

temperature sensors operatively coupled to the plurality of thermal die regions and operative to provide temperature data associated with the plurality of thermal die regions; and thermal wear spreading logic, operatively coupled to the temperature sensors and operative to:
  produce die region wear-out data representing a cumulative amount of time each of the plurality of thermal die regions has spent at a temperature level based on the temperature data;
  store, in persistent memory, the die region wear-out data;
  determine if a short term spreading operation based on operating condition data that is not accumulated over a life of a respective thermal region should override a thermal wear spreading operation that is based on the die region wear-out data that is accumulated over the life of the respective thermal region; and
  when an override condition is met, spread thermal wear among the plurality of thermal die regions based on operating condition data that is not accumulated over the life of a respective thermal region when an override condition exists.

9. The apparatus of claim 8, wherein the thermal wear spreading logic is further operative to accrue the temperature data over the life of each respective thermal region of the plurality of thermal die regions.

10. The apparatus of claim 8, wherein:
the temperature level includes a plurality of temperature ranges;
the die region wear-out data includes data representing a cumulative amount of time each of the plurality of thermal die regions has spent in each of the plurality of temperature ranges; and
the thermal wear spreading logic is further operative to generate wear-out control data by combining the cumulative amount of time each of the plurality of thermal die regions has spent in each of the plurality of temperature ranges.

11. The apparatus of claim 8, wherein the thermal wear spreading logic is further operative to:
determine die region wear-out data by combining die region wear-out data from multiple temperature ranges; and
spread thermal wear among the plurality of thermal die regions by controlling task execution among the plurality of thermal die regions using the die region wear-out data.

12. The apparatus of claim 8, wherein the thermal wear spreading logic is operative to spread thermal wear among the plurality of thermal die regions by remapping of memory addresses for a die region of memory.

13. The apparatus of claim 8, wherein the thermal wear spreading logic is further operative to:
categorize each of the plurality of thermal die regions into a wear-out level based on the die region wear-out data;
order threads in a manner indicative of an amount of heat a thread is determined to cause when executing; and
assign threads such that a thread causing a lower amount of heat is assigned to a die region having a higher wear-out level with respect to another die region.

14. An apparatus, comprising:
at least one integrated circuit package having a plurality of stacked dies each with a plurality of thermal die regions;
temperature sensors operatively coupled to the plurality of thermal die regions and operative to provide temperature data associated with the plurality of thermal die regions;
a persistent memory;
thermal wear spreading logic, operatively coupled to the persistent memory and responsive to the temperature data, and operative to:
  determine die region wear-out data representing a cumulative amount of time each of the plurality of thermal die regions has spent in each of a plurality of temperature ranges based on the temperature data;
  store, in the persistent memory, the die region wear-out data;
  determine if a short term spreading operation based on operating condition data that is not accumulated over a life of a respective thermal region should override a thermal wear spreading operation that is based on the die region wear-out data that is accumulated over the life of the respective thermal region; and
  when an override condition is met, spread thermal wear among the plurality of thermal die regions based on operating condition data that is not accumulated over the life of a respective thermal region when an override condition exists.

15. The apparatus of claim 14, wherein the thermal wear spreading logic is further operative to accrue the temperature data over the life of each respective thermal region of the plurality of thermal die regions.

16. The apparatus of claim 14, wherein the thermal wear spreading logic is further operative to:
determine die region wear-out level data by combining die region wear-out data from multiple temperature ranges; and
spread thermal wear among the plurality of thermal die regions by controlling task execution among the plurality of thermal die regions using the die region wear-out level data.

17. The apparatus of claim 14, wherein the thermal wear spreading logic is operative to spread thermal wear among the plurality of thermal die regions by remapping of memory addresses for a die region of memory.

18. The apparatus of claim 14, wherein the thermal wear spreading logic is further operative to:
categorize each of the plurality of thermal die regions into a wear-out level based on the die region wear-out data;
order threads in a manner indicative of an amount of heat a thread is determined to cause when executing; and
assign threads such that a thread causing a lower amount of heat is assigned to a die region having a higher wear-out level with respect to another die region.

19. The apparatus of claim 14 wherein the thermal wear spreading logic is operative to produce fault detection information by producing data indicating at least one of: an error rate exceeds a threshold or logic timing delays exceed a threshold.

* * * * *